(12) United States Patent
Oman

(10) Patent No.: US 7,324,341 B2
(45) Date of Patent: Jan. 29, 2008

(54) ELECTRONICS ASSEMBLY AND HEAT PIPE DEVICE

(75) Inventor: Todd P. Oman, Greentown, IN (US)

(73) Assignee: Delphi Technologies, Inc., Troy, MI (US)

( * ) Notice: Subject to any disclaimer, the term of this patent is extended or adjusted under 35 U.S.C. 154(b) by 215 days.

(21) Appl. No.: 11/233,147

(22) Filed: Sep. 22, 2005

(65) Prior Publication Data

US 2007/0064396 A1    Mar. 22, 2007

(51) Int. Cl.
*H05K 7/20* (2006.01)

(52) U.S. Cl. ............. 361/700; 361/699; 257/714; 257/715; 165/80.4; 165/104.26; 174/15.2

(58) Field of Classification Search ............ None
See application file for complete search history.

(56) References Cited

U.S. PATENT DOCUMENTS

| | | | | |
|---|---|---|---|---|
| 5,198,889 A | * | 3/1993 | Hisano et al. ............ | 257/678 |
| 5,216,580 A | * | 6/1993 | Davidson et al. .......... | 361/700 |
| 5,780,928 A | * | 7/1998 | Rostoker et al. ........... | 257/713 |
| 5,949,647 A | * | 9/1999 | Kolman et al. ............ | 361/700 |
| 6,450,250 B2 | | 9/2002 | Guerrero ............... | 165/104.33 |
| 6,639,798 B1 | | 10/2003 | Jeter et al. | |
| 6,793,009 B1 | * | 9/2004 | Sarraf ................... | 165/104.33 |
| 6,812,553 B2 | | 11/2004 | Gerbsch et al. | |
| 6,827,133 B1 | * | 12/2004 | Luo ..................... | 165/104.21 |
| 6,873,043 B2 | | 3/2005 | Oman | |
| 6,938,680 B2 | * | 9/2005 | Garner et al. .......... | 165/104.26 |
| 6,973,964 B2 | * | 12/2005 | Hul-Chun .............. | 165/104.26 |
| 6,986,383 B2 | * | 1/2006 | Hsu .................... | 165/104.26 |
| 7,013,957 B2 | * | 3/2006 | Hsu .................... | 165/104.26 |
| 7,032,653 B1 | * | 4/2006 | Chang ................. | 165/104.26 |
| 7,048,039 B2 | * | 5/2006 | Sarraf ................. | 165/104.21 |
| 7,152,667 B2 | * | 12/2006 | Mochizuki et al. ..... | 165/104.34 |
| 2002/0080582 A1 | * | 6/2002 | Chang ................. | 361/700 |
| 2005/0018402 A1 | | 1/2005 | Oman et al. | |
| 2005/0077614 A1 | | 4/2005 | Chengalva et al. | |

OTHER PUBLICATIONS http://www.enertron-inc.com/heatpipes.html. (3 pages).
http://www.thermacore.com/hpt.htm (1 page).

* cited by examiner

*Primary Examiner*—Boris Chèrvinsky
(74) *Attorney, Agent, or Firm*—Jimmy L. Funke

(57) ABSTRACT

An electronics assembly is provided having a heat pipe device for cooling electronics. The assembly includes a substrate and an electronics package supported on the substrate. The assembly also includes a heat pipe device in thermal communication with an exposed surface of the electronics package. The heat pipe device includes a thermal conductive pipe having an internal volume and an open end. The heat pipe device also includes a thermal conductive end cap positioned to close the open end of the pipe. The end cap has an outer surface for receiving in thermal communication an electronics package. The heat pipe device further includes a cooling fluid disposed in the internal volume of the pipe for transferring thermal energy from the end cap to the outside environment.

20 Claims, 3 Drawing Sheets

ELECTRONICS ASSEMBLY AND HEAT PIPE DEVICE

TECHNICAL FIELD

The present invention generally relates to cooling of heat generating electronics and, more particularly, relates to a heat pipe device and electronics assembly having a heat pipe device for cooling electronics.

BACKGROUND OF THE INVENTION

Power electronics devices typically employ electronics packages that generally contain electrical circuitry for conducting electrical current which, in turn, generates thermal energy (i.e., heat). Automotive high-power electronics, such as those employed in electric and hybrid-electric vehicles, including power and control modules, injector drivers, DC-to-AC converters, and power steering electronics, typically generate a significant amount of thermal energy during operation. Excessive heat build-up may cause reduced performance including electrical circuit failure. Thus, thermal energy must be dissipated and transferred away from the electronics to ensure proper operation of the assembly. Additionally, the power capability of the electronics package and size of the electronics assembly generally depends upon the amount of heat dissipation that may be achieved.

Conventional electronics cooling approaches for dissipating thermal energy away from electronics include the use of a thermal conductive heat sink supported in contact with a surface of the electronics package(s). Power semiconductors in the form of flip chips and surface mount electronics packages having a top side cooling tab, e.g., inverted discrete packaging (DPAK) and thermally enhanced ball grid array (BGA), are typically cooled with a conventional finned heat sink. A fan circulates air across the heat sink fins for additional convective heat transfer to enhance the thermal energy exchange.

Another proposed approach to cooling electronics employs a thermal energy path coupled directly to the electronics assembly case through a pedestal. The pedestal contacts the power electronics package and conducts heat. The use of a heat conducting pedestal is beneficial when the assembly must be sealed to prevent moisture intrusion.

A further approach for cooling electronics devices employs a heat pipe device having a working fluid (e.g., water) disposed within a sealed pipe vessel (capsule). The conventional heat pipe device has a saddle interface that wraps around the circumference of the pipe and a heat exchanger opposite ends. When the saddle at one end is sufficiently heated by a heat source, e.g., power electronics device, the working fluid evaporates to transition from liquid to vapor and the vapor travels to the opposite second end of the vessel. Heat from an electronics device is thereby transferred to the working fluid which moves through the heat pipe to transfer thermal energy to the heat exchanger where thermal energy passes to the outside environment. Upon cooling, the vapor condenses back to liquid and returns to the first end via capillary action or gravity.

While prior known cooling approaches achieve significant cooling, it is desirable to provide for an enhanced electronics assembly and heat sink device that is capable of dissipating greater amounts of thermal energy (heat) away from the electronics package in a cost affordable and optimal manner. It is particularly desirable to provide for cost affordable and enhanced cooling of automotive electronics to cool high-power electronics packages that may be employed on an automotive vehicle.

SUMMARY OF THE INVENTION

According to one aspect of the present invention, a heat pipe device for cooling electronics is provided. The heat pipe device includes a thermal conductive pipe having an internal volume and at least one open end. The heat pipe device also has a thermal conductive end cap positioned to seal closed the open end of the pipe. The end cap has an outer surface for receiving in thermal communication an electronics device. The heat pipe device further includes a cooling fluid disposed in the internal volume of the pipe for transferring thermal energy from the end cap to the outside environment.

According to a further aspect of the present invention, an electronics assembly is provided having a heat pipe device for cooling electronics. The assembly includes a substrate and an electronics package supported on the substrate. The electronics package includes electrical circuitry and an exposed side surface. The assembly also includes a heat pipe device in thermal communication with the exposed surface of the electronics package. The heat pipe device includes a thermally conductive pipe having an internal volume and at least one open end. The heat pipe device also includes a thermally conductive end cap positioned to seal closed the open end of the pipe. The end cap has an outer surface in thermal communication with the electronics package. The heat pipe device further includes a cooling fluid disposed in the internal volume of the pipe for transferring thermal energy from the end cap to the outside environment.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
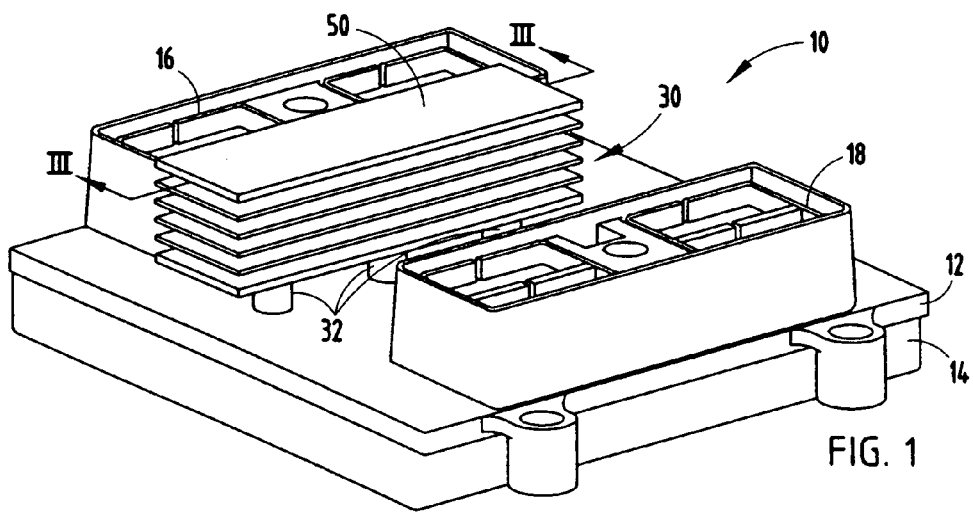
FIG. 1 is a perspective view of an electronics assembly employing a heat pipe device according to the present invention.
Figure 3:
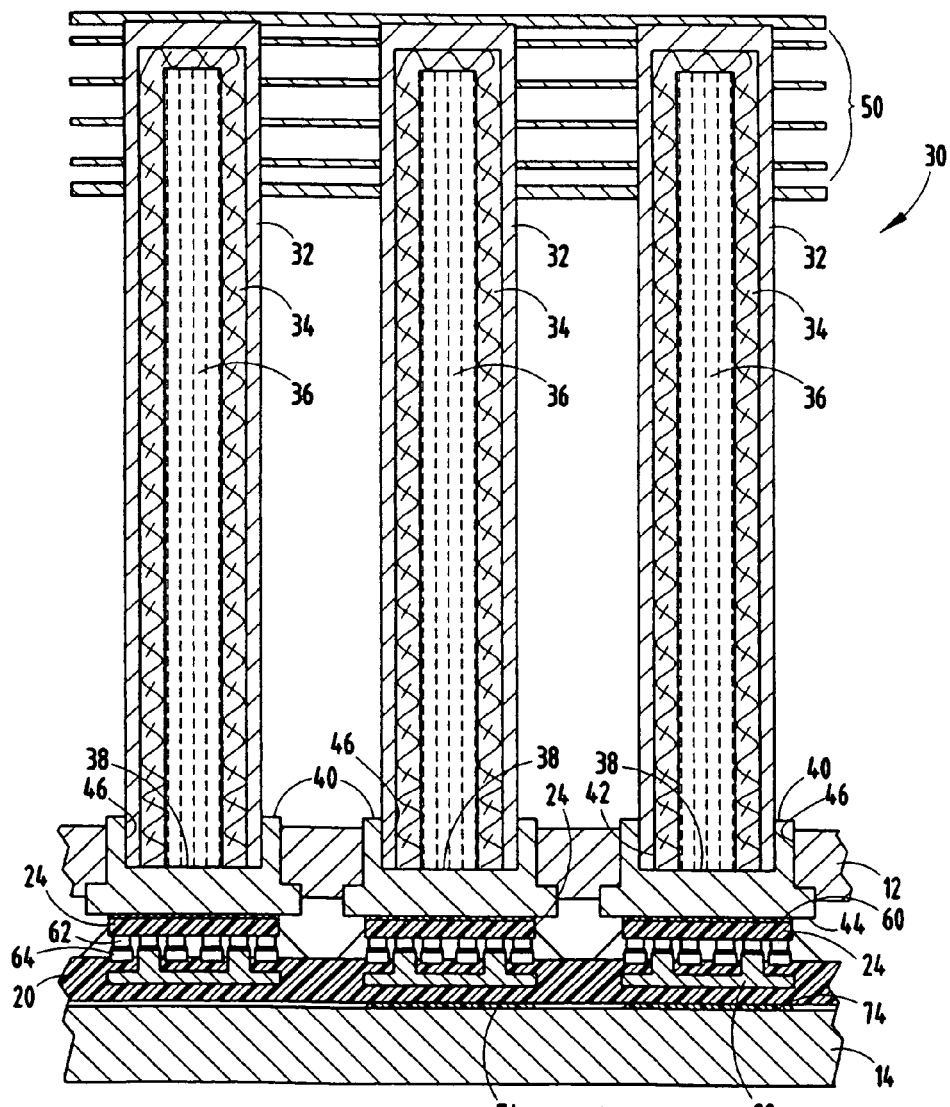
FIG. 3 is a cross-sectional view of the electronics assembly and heat pipe device taken through line III-III in FIG. 1.
Figure 2:
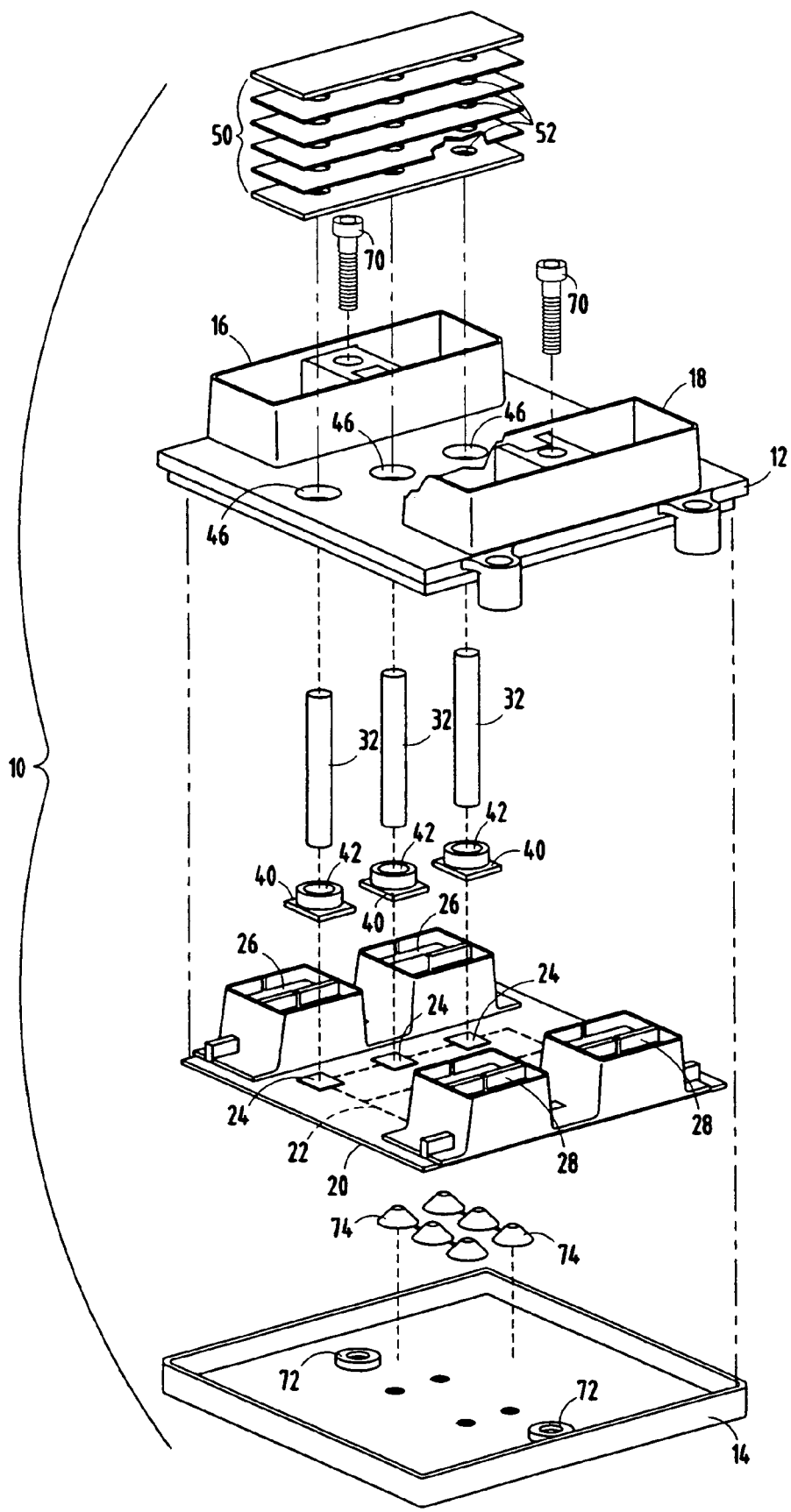
FIG. 2 is an exploded view of a portion of the electronics assembly and heat pipe device shown in FIG. 1.

Referring to FIGS. 1-3, an electronics assembly 10 having heat pipe device 30 is generally illustrated according to one embodiment of the present invention. The heat pipe device 30 according to the present invention is easy to manufacture and provides low cost cooling device for cooling high-power electronics devices. According to one exemplary embodiment, the electronics assembly 10 may include an electronic control module (ECM) containing one or more high-power electronic devices, such as may be employed on electric or hybrid-electric automotive vehicles.

The electronics assembly 10 generally includes a housing (case) shown generally made-up of an uppercase member 12 and lowercase member 14. Case members 12 and 14 are fastened together via threaded fasteners 70 extending through threaded receivers 72. The case may be made of a thermally conductive material such as metal (e.g., steel or aluminum) to further enhance the heat dissipation from within the electronics assembly 10. Electronics assembly 10 is further shown including a pair of electrical connecting terminals 16 and 18 for providing electrical connections to other devices, as should be evident to those skilled in the art.

The electronics assembly 10 also includes a substrate 20, such as a printed circuit board, containing electrical circuitry 22 and one or more electronic packages 24. The substrate 20 is disposed within the housing between case members 12 and 14. In the embodiment shown, substrate 20 is biased upward via a plurality of cone-shaped elastomers 74.

The substrate 20 may include a printed circuit board according to one embodiment. Substrate 20 may be made of a low temperature co-fired ceramic (LTCC), an organic material such as FR4, a metal such as stainless steel, or any other suitable material. The substrate 20 may have electrical circuitry formed on the top side surface and/or bottom side surface, as well as between laminated intermediate layers of the substrate 20. In the embodiment shown, electrical circuitry 22 is shown in dashed lines formed extending into and through an intermediate layer to provide electrical current transmission paths.

Assembled onto the printed circuit board 20 are one or more electronics packages 24, each having electrical circuitry that generates thermal energy (heat) when conducting electrical current during operation. The electronics packages 24 may be mounted on top of the circuit board 20, or connected within openings in the circuit board 20, and are electrically connected to electrical circuitry provided on the circuit board 20. In the embodiment shown, the electronics packages 24 each have solder bumps 62 formed on the bottom side solder-connected to pads 64 on top of the circuit board 20. Other electrical connections such as wire-bonds may be employed according to other embodiments.

Any of a number of electronics packages 24 may be employed which include one or more semiconductor devices, such as transistors configured to provide controlled switching operation, operate as a diode, provide voltage regulation, or perform other functions. The electronics packages 24 may be fabricated semiconductor chips, such as flip chips with wire-bonded or solder-bump connections that are electrically and/or physically coupled to the substrate 20. Electronics packages 24 may include power semiconductors in the form of flip chips and surface mount electronics packages having a top side cooling tab, such as may be present in an inverted DPAK and thermally enhanced BGA, according to exemplary embodiments. According to other exemplary embodiments, the electronics packages 24 may include automotive high-power electronics, such as those employed on electric and hybrid-electric vehicles, including power and control modules, injector drivers, DC-to-AC converters, and power steering electronics. Further, electronics packages 24 may include field effect transistors (FETS), isolated gate bipolar transistors (IGBTS), electrical components such as resistors and capacitors, and other electrical devices that generate thermal energy during operation.

The electronics assembly 10 of the present invention employs a heat pipe device 30 disposed in thermal communication with the top side of corresponding electronic packages 24. In the embodiment shown, the electronic packages 24 have a substantially flat upper surface for interfacing with the heat pipe device 30. The heat pipe device 30 shown and described herein includes three heat pipes 32 in thermal communication with three corresponding electronic packages (devices) 24 for cooling electronic packages 24. However, it should be appreciated that the heat pipe device 30 may employ one or more heat pipes 32 for cooling one or more electronic devices 24.

Figure 4:
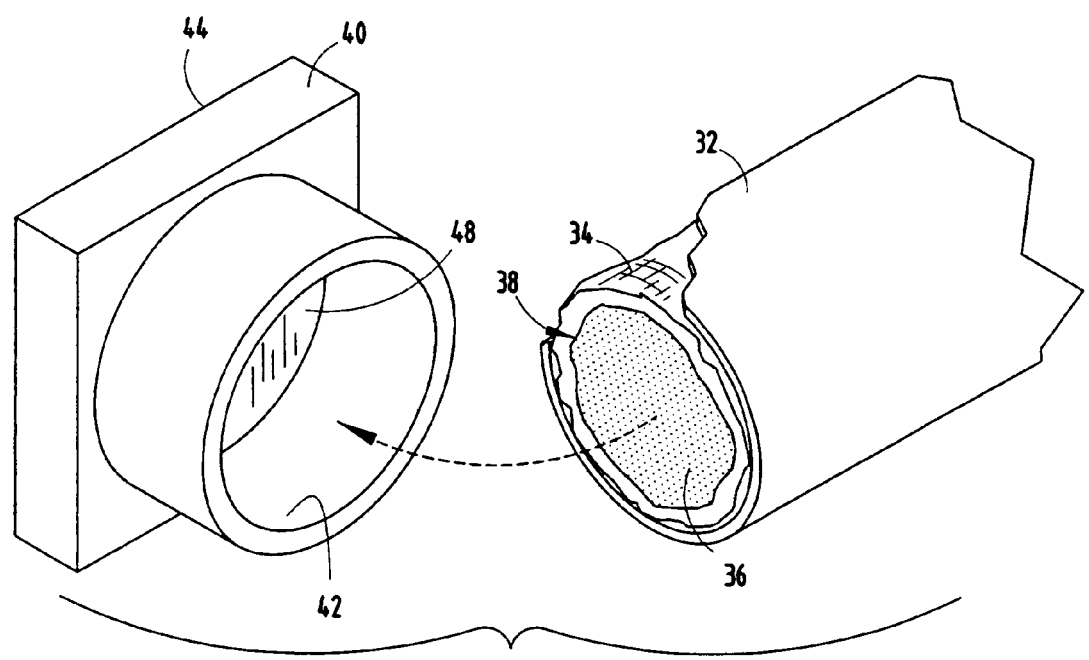
FIG. 4 is a partial exploded view of one end of the heat pipe device.
Figure 5:
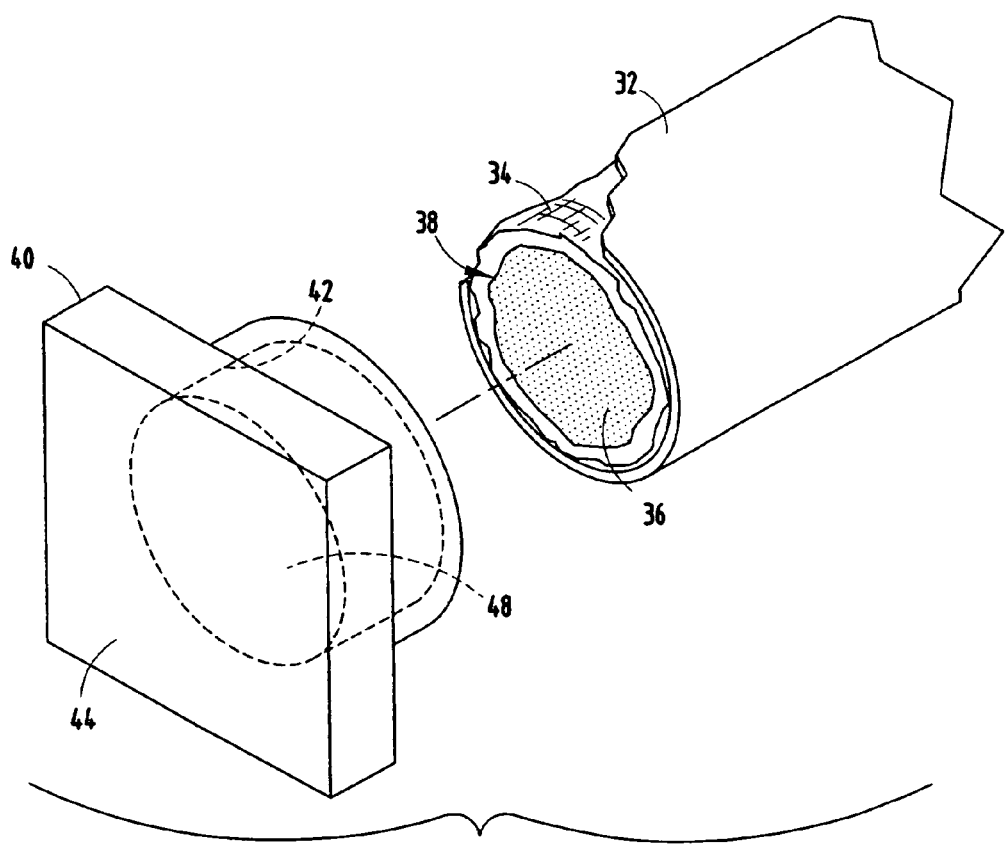
FIG. 5 is another partial exploded view of the one end of the heat pipe device.

Each heat pipe 32 is formed as a vessel made of a thermally conductive material such as copper or aluminum, and has an internal volume and an open end 38. In the embodiment shown, the heat pipe vessel 32 has a cylindrical shape. However, other shapes, such as rectangular shapes may be employed. The heat pipe device 30 further includes an integrated heat spreader in the form of an end cap 40. With particular reference to FIGS. 4 and 5, end cap 40 is configured with a collar 42 shaped to receive and seal closed the open end 38 of the heat pipe 32. The end cap 40 is sealed to open end 38 of heat pipe 32 via soldering, according to one embodiment. As such, end cap 40 provides a sealed closure to the heat pipe vessel 32.

The end cap 40 is made of a thermally conductive material such as copper or aluminum and has an outer surface 44 for receiving in thermal communication one of the electronics packages 24. End cap 40 also has an inner surface 48 exposed to the internal volume of pipe 32. The outer surface 44 of end cap 40 is substantially flat to conform to and interface with the upper surface of the electronics package 24. Alternatively, outer surface 44 could otherwise be configured to accommodate different shaped surfaces of packages 24. The outer surface 44 is oriented substantially perpendicular to a longitudinal axis of the heat pipe 32.

Disposed within heat pipe 32 is a working fluid 36 that operates to transfer thermal energy from one end 38 of the heat pipe 32 in thermal communication with one of the electronics packages 24 to an opposite end of the heat pipe 32. The working fluid 36 may include de-ionized water, according to one embodiment. According to another embodiment, the working fluid 36 may include methanol. Additionally, a wick material 34 is shown lining the internal surface of heat pipe 32. Wick material 34 may include a cloth membrane, a layer of sintered metal powders, or a wire mesh, that moves working fluid liquid via capillary action toward the end cap 40. It should be appreciated that the heat pipe 30 may be implemented without a wick material 34 according to another embodiment. In doing so, the heat pipe device 30 may be oriented vertically such that gravity acts to move the working fluid liquid towards the end cap 40.

Additionally, the heat pipe device 30 includes a heat exchanger 50 located at the second end opposite the open first end 38 of the heat pipe 32. The heat exchanger 50 is shown having a plurality of cooling fins made of a generally thermally conductive material and spaced apart to allow for an ambient cooling fluid to pass by the fins, according to one embodiment. At least some of the cooling fins are shown having openings 52 for receiving heat pipes 32. The fins may be soldered or otherwise adhered to pipes 32. The ambient cooling fluid may include forced air, non-forced air or liquid. The heat exchanger 50 operates to convectively cool the second end of the heat pipe 30 to transfer thermal energy to the ambient cooling fluid.

The heat pipe 32 and end cap 40 may be assembled within an opening 46 in uppercase member 12 by either extending tube 32 into opening 46 and soldering the end cap 40 onto the open end 38 of cap 40, or by soldering end cap 40 onto heat pipe 32 and then inserting the heat pipe 32 through opening 46. The uppercase member 12 and heat pipes 32 are then assembled above circuit board 20 such that the flat interface surface 44 of end cap 40 is in thermal communication with the upper surface of a corresponding electronics package 24. A thermal conductive medium 60 may be disposed between the upper surface of electronics package 24 and lower surface 44 of end cap 40. The thermal conductive medium 60 may include a thermally conductive grease or a thermally conductive adhesive. The upper and lowercase members 12 and 14 are then fastened together via threaded fasteners 70 such that elastomers 74 are compressed to bias the circuit board 20 and electronics package 24 upward to maintain efficient thermal communication between the electronics package 24 and heat pipe device 30.

In operation, the heat pipe device 30 operates to dissipate heat from the electronic packages 24 to the outside ambient environment. In doing so, thermal energy at each electronic package 24 passes through the thermal conductive medium 60 to end cap 40. Thermal energy at the end cap 40 in turn heats the working fluid 36 within heat pipe 32. The heated working fluid causes at least some of the liquid (de-ionized water) to evaporate to a vapor state. The vapor then passes generally through the central portion of the heat pipe 32 from the first end 38 toward the opposite second end, where it is cooled by the heat exchanger 50. Upon cooling by heat exchanger 50, the vapor transitions back to a liquid state and is returned via capillary action and/or gravity back towards the first end 38 of heat pipe 32.

Accordingly, the heat pipe device 30 of the present invention advantageously dissipates thermal energy away from one or more electronic packages 24. As a result, electronic packages 24 having increased power and reduced component size may be employed in the electronics assembly 10. For a given power requirement, the present invention allows for improved performance and reliability. By incorporating the heat pipe device 30 in the electronics assembly 10, heat generated by the electronic packages 24 is conductively and convectively transferred to the remote heat exchanger 50 and thus to the outside ambient environment. It should be appreciated that the heat is dissipated by a fluid that is cooler than the operating temperature of the heat pipe 32. The end cap 40 serves to plug the heat pipe 32 and also acts as a thermal conductive interface to receive thermal energy from electronics package 24 and spread the heat efficiently to the heat pipe 32 for dissipation via heat pipe device 30.

While the heat pipe device 30 is generally shown having three heat pipes 32 in thermal communication with three electronic packages on one side of circuit board 20, it should be appreciated that other numbers of heat pipes may be employed to cool various numbers of electronic packages 24. Additionally, it should be appreciated that the heat pipes 32 may be employed on more than one side of the circuit board 20. For example, heat pipes 32 may be employed on both the upper and lower surfaces to engage multiple electronics packages 24 or to engage opposite sides of an electronics package 24 for dual-side cooling.

By enhancing the heat dissipation, particularly for high-powered electronics packages 24, the electronics assembly 10 advantageously allows for the reduction in the number and/or size of power packages used in the assembly 10, thereby reducing the size and cost of the overall electronics assembly 10. Additionally, the enhanced heat dissipation achieved with the present invention may allow for an increase in the power output of the electronics packages 24, thereby improving the overall performance of the electronics assembly 10. These and other advantageous may be achieved by the novel cooling design of the present invention.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. A heat pipe device for cooling electronics, said heat pipe device comprising:
 a case housing an electronics device, said case having an opening;
 a thermal conductive pipe having an internal volume and at least one open end, wherein the open end of the thermal conductive pipe extends into said opening of said case;
 a thermal conductive end cap positioned in the case to seal closed the open end of the pipe, said end cap having an outer surface for receiving in thermal communication the electronics device, wherein the thermal conductive end cap is configured with a collar shaped to receive and seal closed the open end of the pipe; and
 a cooling fluid disposed in the internal volume of the pipe for transferring thermal energy from the end cap to the outside environment.

2. The heat pipe device as defined in claim 1 further comprising a heat exchanger in thermal communication with the pipe for dissipating thermal energy to the outside environment.

3. The heat pipe device as defined in claim 2, wherein the heat exchanger comprises a plurality of thermally conductive fins.

4. The heat pipe device as defined in claim 3 further comprising an ambient fluid flowing in communication with the fins.

5. The heat pipe device as defined in claim 1, wherein the end cap is soldered to the pipe to seal closed the open end.

6. The heat pipe device as defined in claim 1, wherein the end cap has a generally flat surface for interfacing with the electronic device, and wherein the flat surface is substantially perpendicular to a longitudinal axis of the pipe.

7. The heat pipe device as defined in claim 1, wherein the cooling fluid comprises liquid.

8. The heat pipe device as defined in claim 7, wherein the cooling fluid comprises de-ionized water.

9. The heat pipe device as defined in claim 1 further comprising a thermal conductive interface material disposed between the end cap and the electronics device.

10. An electronics assembly comprising:
 a substrate;
 a case having an opening;
 an electronics package supported on the substrate and located in the case, said electronics package comprising electrical circuitry and an exposed side surface; and
 a heat pipe device in thermal communication with the exposed surface of the electronics package, said heat pipe device comprising:
 a thermal conductive pipe having an internal volume and at least one open end, wherein the open end of the thermal conductive pipe extends into said opening of said case;
 a thermal conductive end cap positioned in the case to close the open end of the pipe, said end cap having an outer surface in thermal communication with the exposed side surface of the electronics package, wherein the thermal conductive end cap is configured with a collar shaped to receive and seal closed the open end of the pipe; and a cooling fluid disposed in the internal volume of the pipe for transferring thermal energy from the end cap to the outside environment.

11. The electronics assembly as defined in claim 10 further comprising a thermal conductive medium disposed between the exposed side surface of the electronics package and the end cap.

12. The electronics assembly as defined in claim 11, wherein the thermal conductive medium comprises one of a thermal conductive grease and a thermal conductive adhesive.

13. The electronics assembly as defined in claim 10, wherein the substrate comprises a circuit board having electrical circuitry.

14. The electronics assembly as defined in claim 10, wherein the electronics assembly is employed on a vehicle.

15. The electronics assembly as defined in claim 10 further comprising a heat exchanger in thermal communication with the pipe for dissipating thermal energy to the outside environment.

16. The electronics assembly as defined in claim 15, wherein the heat exchanger comprises a plurality of thermally conductive fins.

17. The electronics assembly as defined in claim 10, wherein the cooling fluid comprises liquid.

18. The electronics assembly as defined in claim 17, wherein the cooling fluid comprises de-ionized water.

19. The electronics assembly as defined in claim 10, wherein the end cap comprises a metal end cap.

20. The heat pipe device as defined in claim 1, wherein the end cap comprises a metal end cap.

* * * * *